United States Patent
Hagen et al.

(10) Patent No.: US 11,387,610 B2
(45) Date of Patent: Jul. 12, 2022

(54) MECHANICAL INTERLOCK WITH ENHANCED FEATURES

(71) Applicant: LEVITON MANUFACTURING CO., INC., Melville, NY (US)

(72) Inventors: William Hagen, Melville, NY (US); Eugene Frid, Great Neck, NY (US); Jose Torres Barrera, Melville, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 0 days.

(21) Appl. No.: 16/616,592

(22) PCT Filed: Nov. 14, 2019

(86) PCT No.: PCT/US2019/061364
§ 371 (c)(1),
(2) Date: Nov. 25, 2019

(87) PCT Pub. No.: WO2020/123086
PCT Pub. Date: Jun. 18, 2020

(65) Prior Publication Data
US 2021/0167560 A1 Jun. 3, 2021

Related U.S. Application Data

(60) Provisional application No. 62/777,328, filed on Dec. 10, 2018.

(51) Int. Cl.
*H01R 13/70* (2006.01)
*H01R 13/73* (2006.01)
(Continued)

(52) U.S. Cl.
CPC ............. *H01R 13/73* (2013.01); *H01H 21/06* (2013.01); *H01L 21/22* (2013.01);
(Continued)

(58) Field of Classification Search
None
See application file for complete search history.

(56) References Cited

U.S. PATENT DOCUMENTS

| | | | |
|---|---|---|---|
| 1,818,290 A | 8/1931 | Wulle | |
| 3,887,256 A | 6/1975 | Klimek et al. | |

(Continued)

FOREIGN PATENT DOCUMENTS

| | | | |
|---|---|---|---|
| GB | 249635 A | 4/1926 | |
| GB | 1599306 A | 9/1981 | |

OTHER PUBLICATIONS

International Search Report and Written Opinion for the International Patent Application No. PCT/US19/61364, dated Mar. 19, 2020, 10 pages.

(Continued)

*Primary Examiner* — Felix O Figueroa
(74) *Attorney, Agent, or Firm* — KDB

(57) ABSTRACT

A mechanical interlock including one or more features to facilitate easier assembly and/or manufacturing. Additionally, and/or alternatively, the mechanical interlock may include one ore more features to provided increased protection. The mechanical interlock may include a baseplate arranged and configured to receive one or more components thereon so that the components can be coupled and wired as a sub-assembly prior to inserting into the enclosure. The mechanical interlock may include an adapter positioned between a connector and a contact carrier bracket to enable variously sized connectors to be coupled to a common contract carrier bracket. The adapter may include one ore more keys to prevent improper coupling of the adapter. The contact carrier bracket may be arranged and configured to receive one or more PCBs to provide an increased level of protection for the PCB.

23 Claims, 5 Drawing Sheets

(51) Int. Cl.
   *H01H 21/06* (2006.01)
   *H01L 21/22* (2006.01)
   *H01R 13/516* (2006.01)
   *H01R 24/76* (2011.01)
   *H01R 12/70* (2011.01)

(52) U.S. Cl.
   CPC ....... *H01R 12/7005* (2013.01); *H01R 13/516* (2013.01); *H01R 13/70* (2013.01); *H01R 24/76* (2013.01); *H01H 2207/022* (2013.01)

(56) References Cited

U.S. PATENT DOCUMENTS

| | | | |
|---|---|---|---|
| 4,736,999 A | | 4/1988 | Marks |
| 5,298,701 A | | 3/1994 | Sandor |
| 5,449,302 A | | 9/1995 | Yarbrough |
| 5,632,655 A | | 5/1997 | DeMarco |
| 5,741,149 A | * | 4/1998 | Anthony ............. H01R 13/707 439/314 |
| 5,880,420 A | * | 3/1999 | Rohmer ................. H01R 13/71 200/50.28 |
| 6,302,726 B1 | * | 10/2001 | Marechal ............. H01R 13/465 439/491 |
| 6,956,176 B2 | | 10/2005 | Castaldo |
| 7,119,292 B2 | | 10/2006 | Castaldo |
| 8,281,951 B2 | | 10/2012 | Wilson et al. |
| 9,472,908 B2 | * | 10/2016 | Shendge ............. H01R 13/639 |
| 9,812,811 B1 | | 11/2017 | Gorin et al. |
| 2008/0179073 A1 | | 7/2008 | Drane et al. |

OTHER PUBLICATIONS

International Search Report and Written Opinion of PCT/US2018/055973, dated Dec. 26, 2018.

* cited by examiner

MECHANICAL INTERLOCK WITH ENHANCED FEATURES

CROSS-REFERENCE TO RELATED APPLICATIONS

This application is a United States National Phase filing of International Application No. PCT/US2019/061364, filed Nov. 14, 2019, which is a non-provisional of, and claims the benefit of the filing date of, U.S. provisional patent application No. 62/777,328, filed Dec. 10, 2018, entitled "Mechanical Interlock with Enhanced Features," which applications are incorporated in their entirety by reference herein.

FIELD OF THE DISCLOSURE

The present disclosure relates generally to electrical devices such as mechanical interlocks, disconnect switches, rotatably actuatable switches, etc., and more particularly to mechanical interlocks incorporating one or more enhanced features to facilitate easier assembly and/or manufacturability, and/or to provide additional protection from, for example, the environment, physical damage, etc.

BACKGROUND OF THE DISCLOSURE

Electrical switches such as, for example, disconnect switches, mechanical interlocks, rotatably actuatable switches, etc. (collectively referred to herein as a mechanical interlock or mechanical interlocks without the intent to limit) are used in a variety of commercial applications, both indoors and outdoors, for energizing and de-energizing electrical devices, such as machinery, motors, lights, fans, pumps, generators and the like.

Generally speaking, mechanical interlocks are arranged and configured to receive, for example, one or more pin and sleeve devices such as, for example, a plug to supply electrical power to downstream electrical devices. Mechanical interlocks are generally designed for use in harsh or high abuse environments such as, for example, wet, dusty, or corrosive environments.

As will be appreciated by one of ordinary skill in the art, mechanical interlocks include, inter alia, an electrical enclosure, an external handle assembly connected to an electrical load switch located within the electrical enclosure, and a connector (e.g., a female receptacle) for coupling to the plug. The mechanical interlock may also include a number of other electrical and mechanical components such as, for example, a contact carrier bracket, one or more printed circuit boards (PCBS), one or more fuses, one or more contactors, etc.

In use, in one example embodiment, the mechanical interlock receives power through a plurality of power input lines and supplies power to, for example, a plug coupled to the connector. The external handle assembly mounted to the front of the enclosure may be connected to the load switch through, for example, a shaft to operate the actuating mechanism of the load switch. In use, the external handle assembly is rotationally locked to the load switch via the shaft. Thus arranged, rotational movement of the handle assembly causes the shaft to rotate, which in turn rotates the load switch to selectively supply and disconnect power from the connector, and hence the plug and the downstream electrical device.

That is, in use, the downstream electrical device can be energized or de-energized, depending on the direction of rotation of the handle assembly. That is, the mechanical interlock is "ON" (e.g., supplying power to the connected, downstream electrical device) when the plug is coupled to the connector and the handle assembly is in an "ON" position. When the handle assembly is moved to an "OFF" position, the actuating mechanism of the load switch will have been moved to open the contacts, so that power to the associated electrical device is disconnected. Generally speaking, the handle assembly is rotated ninety-degrees to transition the mechanical interlock between the ON and OFF positions.

In use, mechanical interlocks include a locking mechanism that prevents making and breaking of power under load. That is, in use, the mechanical interlock is arranged and configured so that the handle assembly cannot be moved to the "ON" position until a plug is coupled to the connector. Similarly, in use, the mechanical interlock is arranged and configured so that the plug cannot be removed or decoupled from the connector of the mechanical interlock until the handle assembly has been rotated or actuated to the OFF position. That is, for example, until the handle assembly has been rotated to the OFF position, the plug cannot be removed. In this manner, mechanical interlocks prevent making or breaking of power under load. This is a simplified explanation of the operation of the mechanical interlock for purposes of the present disclosure.

As will be appreciated by one of ordinary skill in the art, given the complexity of the devices and, as a result, the number of components required, assembling and wiring of the various components within the enclosure of the mechanical interlock can be challenging. As a result, it would be desirable to provide mechanical interlocks with one or more enhanced features to facilitate easier assembly and/or manufacturability. Additionally, it would be desirable to provide mechanical interlocks with one or more features to provide improved protection from, for example, the environment, physical damage, or the like.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, disclosed herein is a mechanical interlock including an enclosure, a connector at least partially receivable within the enclosure for selectively receiving a plug, a load switch positionable within the enclosure, the load switch arranged and configured to selectively supply power to the connector, a contact carrier bracket for coupling the connector to the enclosure, and a base plate arranged and configured for receiving the contact carrier bracket and the load switch thereon to form a subassembly.

In another embodiment, the mechanical interlock may include an enclosure, a connector at least partially receivable within the enclosure for selectively receiving a plug, a load switch positionable within the enclosure, the load switch arranged and configured to selectively supply power to the connector, a contact carrier bracket for coupling the connector to the enclosure, and an adapter for operatively coupling the connector to the contact carrier bracket, the adapter selected from a plurality of adapters, each adapter of said plurality of adapters having at least one of a size and a shape that is different from other adapters of said plurality of adapters, the selected adapter sized and shaped to engage the connector.

In yet another embodiment, the mechanical interlock may include an enclosure, a connector at least partially receivable within the enclosure for selectively receiving a plug, a load switch positionable within the enclosure, the load switch arranged and configured to selectively supply power to the connector, a contact carrier bracket for coupling the connector to the enclosure, and a printed circuit board (PCB) electrically coupleable to the load switch and the connector, the PCB coupleable to the contact carrier bracket to provide protection to the PCB.

BRIEF DESCRIPTION OF THE DRAWINGS

By way of example, a specific embodiment of the disclosed device will now be described, with reference to the accompanying drawings, in which.

Figure 1:
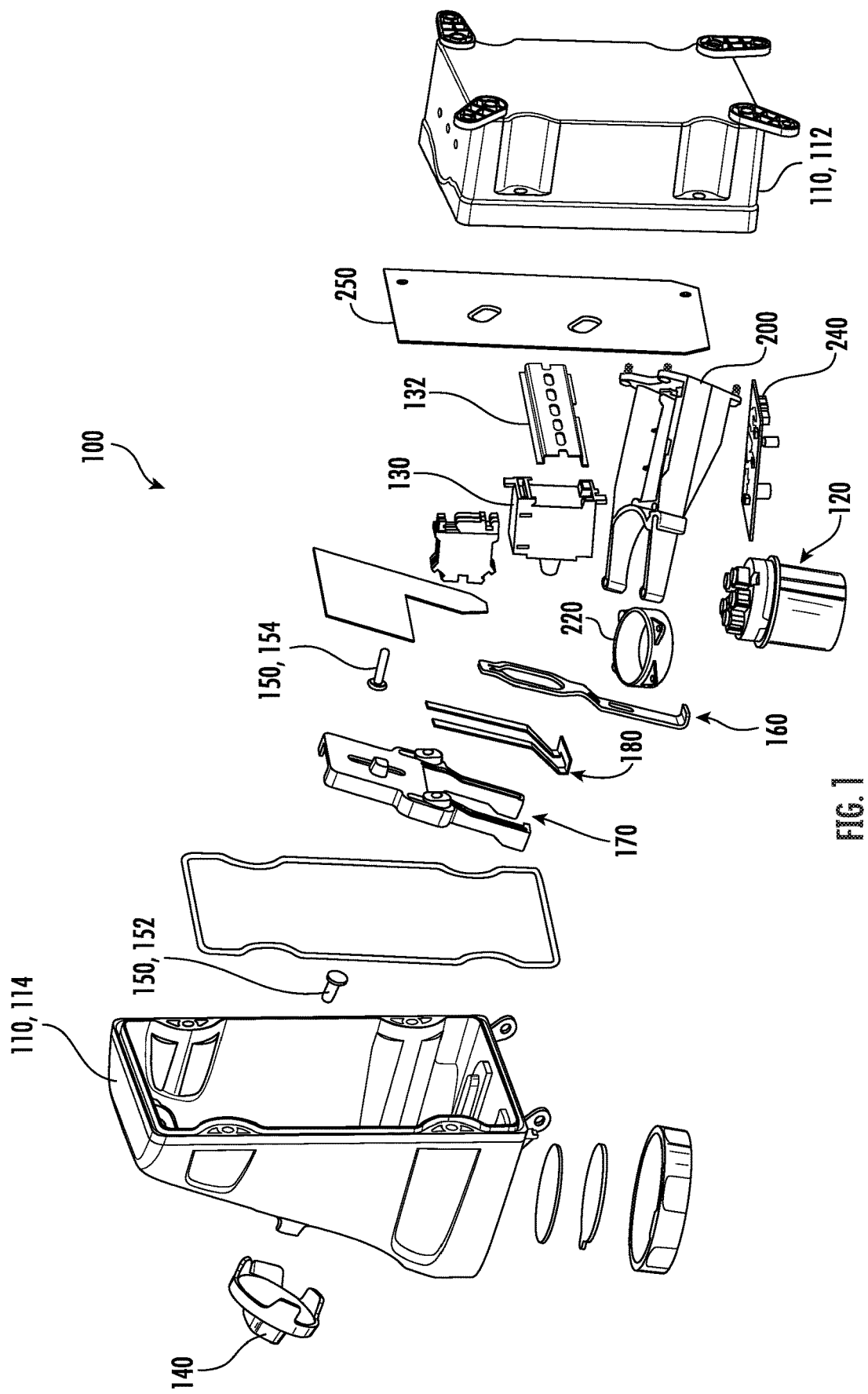
FIG. 1 is an exploded, perspective view of a mechanical interlock in accordance with one or more aspects of the present disclosure.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

DETAILED DESCRIPTION

Numerous embodiments of improved mechanical interlocks in accordance with the present disclosure will now be described more fully hereinafter with reference to the accompanying drawings, in which preferred embodiments of the present disclosure are presented. The mechanical interlock of the present disclosure may, however, be embodied in many different forms and should not be construed as being limited to the embodiments set forth herein. Rather, these embodiments are provided so that this disclosure will convey certain example aspects of the mechanical interlock to those skilled in the art. In the drawings, like numbers refer to like elements throughout unless otherwise noted.

As will be described in greater detail below, in various embodiments, a mechanical interlock according to the present disclosure may include one or more features to facilitate assembly and/or manufacturing. Additionally, and/or alternatively, the mechanical interlock may include one or more features to provided increased protection from, for example, the environment (e.g., water, etc.), physical damage, etc. For example, in one embodiment according to the present disclosure, a mechanical interlock may include a baseplate to facilitate easier assembly. The base plate is arranged and configured to receive one or more components of the mechanical interlock thereon so that the components can be initially coupled to the base plate and wired to each other without the space constraints of the enclosure of the mechanical interlock. Thereafter, the base plate including the components coupled thereto can be positioned within and coupled to the enclosure.

In addition, and/or alternatively, the mechanical interlock may include an adapter positioned between a connector (e.g., a female receptacle for receiving a male plug) and a contact carrier bracket. By incorporating an adapter, different sized connectors can be coupled to a common contact carrier bracket thus minimizing complex tooling and reducing costs generally associated with manufacturing and storing numerous, individually sized contact carrier brackets. Moreover, the adapter may include one or more keys (e.g., a Poke-Yoke feature) to facilitate easier assembly and/or to prevent human errors caused by improper assembly. For example, in one embodiment, the adapter may include one or more keys to prevent improper coupling of the adapter to the contact carrier bracket. Additionally, the adapter may include one or more keys to prevent improper coupling of the adapter to the connector. In this manner, by keying the position of the connector relative to the adapter and by keying the position of the adapter relative to the contact carrier bracket, proper positioning (e.g., proper clock positioning of the connector relative to the contact carrier bracket) is ensured.

Additionally, and/or alternatively, the contact carrier bracket may be arranged and configured to receive one or more PCBs. That is, in one embodiment, a PCB may be coupled to the contact carrier bracket to provide an increased level of protection from the environment (e.g., water, etc.) and to provide an increased level of protection from damage associated, for example, with dropping the device, transportation, etc.

As will be described herein, the features according to the present disclosure may be used with any suitable mechanical interlock now known or hereafter developed. As such, details regarding construction and operation of the mechanical interlock are omitted for sake of brevity of the present disclosure. In this regard, the present disclosure should not be limited to the details of the mechanical interlock disclosed and illustrated herein unless specifically claimed and that any suitable mechanical interlock can be used in connection with the principles of the present disclosure.

As previously mentioned, mechanical interlocks can be used to supply power to connected devices via, for example, a pin and sleeve device such as, for example, a plug. That is, for example, a plug can be connected to the mechanical interlock for supplying power to a downstream electrical device.

Referring to FIG. 1, in one illustrated embodiment, the mechanical interlock 100 may include a number of components including, inter alia, an enclosure 110, a connector 120 for coupling to, for example, a plug 50 (FIG. 3) to supply power to a downstream connected electrical device, an internal load switch 130 for selectively energizing and de-energizing the connector 120, an external handle assembly 140 movable between an ON position and an OFF position to control the internal load switch 130, and a shaft 150 for rotationally coupling the external handle assembly 140 to the internal load switch 130. In the illustrated embodiment, the shaft 150 may be in the form of a two-piece shaft so that the external handle assembly 140 may be operatively coupled to a handle shaft 152 and the load switch 130 may be coupled to a switch shaft 154, the handle shaft 152 may be rotationally coupled to the switch shaft 154 so that rotation of the external handle assembly 140 rotates the handle shaft 152, which rotates the switch shaft 154, which rotates/actuates the load switch 130.

As illustrated, the mechanical interlock 100 may also include an optional Deutsche Institut für Normung (i.e., German Institute of Standards) ("DIN" rail 132 for receiving the load switch 130. The mechanical interlock 100 may also include an interlock latch 160, a slider plate 170, and a latch spring 180 operatively associated with the external handle assembly 140 and the connector 120 for selectively enabling rotation of the external handle assembly 140. As will be described in greater detail below, the mechanical interlock 100 may also include a contact carrier bracket 200 and an adapter 220 for coupling the connector 120 relative to the enclosure 110. The mechanical interlock 100 may also include one or more printed circuit boards (PCBs) such as, for example, PCB 240 coupled to the contact carrier bracket 200 as will be described in greater detail below.

As illustrated, the enclosure 110 may be made up of a rear housing portion or base 112 and a front housing portion or cover 114, although it is envisioned that the enclosure 110 may be manufactured from more or less portions. In addition, the enclosure 110 may be manufactured from any suitable material including, for example, plastic, metal, or the like.

As will be appreciated by one of ordinary skill in the art, given the tight space constraints within the enclosure 110 and the large number of components being positioned therein, assembly of the mechanical interlock 100 can be challenging. For example, wiring the connector 120, the internal load switch 130, and the PCB 240 can be challenging once those components are positioned within the side walls of the enclosure 110 (e.g., base 112).

Figure 2:
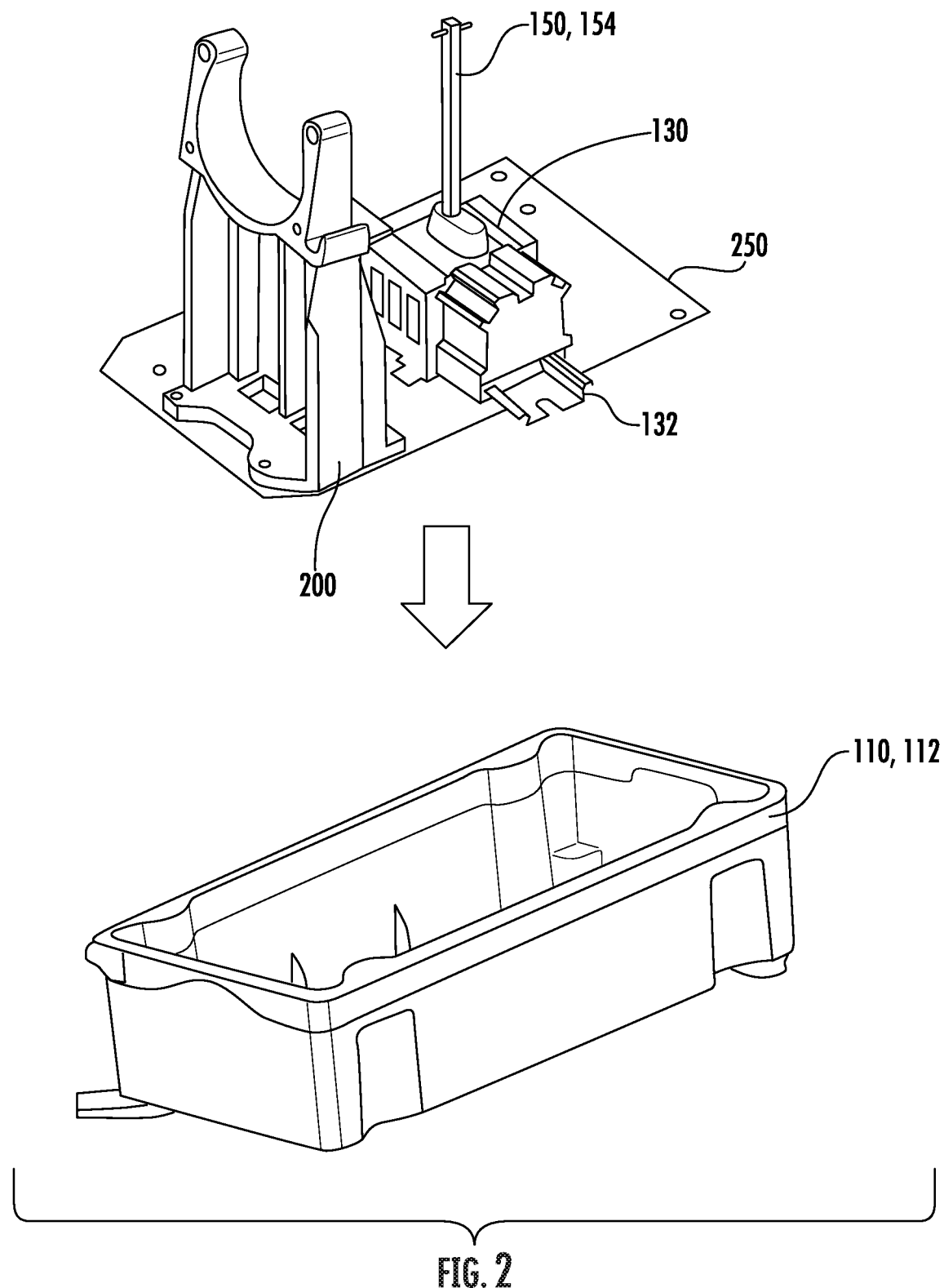
FIG. 2 is a partial, exploded perspective view of a subassembly in accordance with one aspect of the mechanical interlock shown in FIG. 1, the subassembly including a base plate.

In accordance with one aspect of the present disclosure, referring to FIGS. 1 and 2, to facilitate easier assembly, the mechanical interlock 100 may include a base plate, carrier, platform, chassis, or the like (collectively referred to herein as a base plate without the intent to limit) 250. In use, the base plate 250 is arranged and configured to receive one or more components thereon so that the components can be initially coupled to the base plate 250 and wired to each other without the space constraints of the enclosure 110 (e.g., base 112). Thereafter, the base plate 250 including the components coupled thereon can be positioned within the enclosure 110 and the base plate 250 can be coupled to the enclosure 110 via, for example, one or more fasteners. For example, as illustrated, in one example embodiment, the DIN rail 132 can be coupled to the base plate 250. Thereafter, the internal load switch 130 can be coupled to the DIN rail 132. Alternatively, the internal load switch 130 can be coupled directly to the base plate 250 without the intervening DIN rail 132. Additionally, the contact carrier bracket 200 can be coupled to the base plate 250. Thereafter, the connector 120 can be coupled to the contact carrier bracket 200. The internal load switch 130 can also be electrically coupled or wired to the connector 120. In addition, a PCB 240 (FIG. 1) may be coupled to the contact carrier bracket 200 and electrically coupled or wired to the connector 120 and/or internal load switch 130 as required. All of this assembly can be completed without the space constraints of the enclosure 110. Thereafter, once the components have been coupled to the base plate 250 and/or electrically coupled or wired to each other, the base plate 250 and the components mounted thereto can be positioned within the enclosure 110 (e.g., base 112) and one or more fasteners can be used to couple the base plate 250 to the enclosure 110 (e.g., base 112).

In this manner, referring to FIG. 2, the base plate 250 enables a stand-alone subassembly or module of components to be assembled and/or wired together prior to positioning within the enclosure 110. That is, the base plate 250 is arranged and configured as a platform for component assembly so that components and any electrical wiring can be assembled onto the baseplate 250 without the enclosure sidewalls limiting access to connection and access points. Once completed, the base plate 250 and the components assembly thereto can be positioned into the walled enclosure 110 and coupled thereto.

The base plate 250 may be manufactured from any suitable material including, for example, metal such as, for example, galvanized steel. As illustrated, the base plate 250 may have a rectangular shape although it is envisioned that the base plate 250 may have any other suitable shape and/or size. In addition, although illustrated as a single component, it is envisioned that the base plate may be formed of multiple pieces.

As will be appreciated by one of ordinary skill in the art, the number of plug configurations is extensive. As such, each mechanical interlock is adapted and configured with a particular connector 120 for receiving a corresponding plug. However, each connector 120, depending on the plug's configuration, voltage, etc., may have a different size and/or clock position, as will be described in greater detail. As such, it is not uncommon for manufacturers to make and store a number of differently sized contact carrier brackets corresponding to a number of different connectors. That is, under current manufacturing techniques, a unique contact carrier bracket may be required for every unique plug and connector configuration. However, given their overall shape, manufacturing of contact carrier brackets can be complex and expensive.

Figure 3:
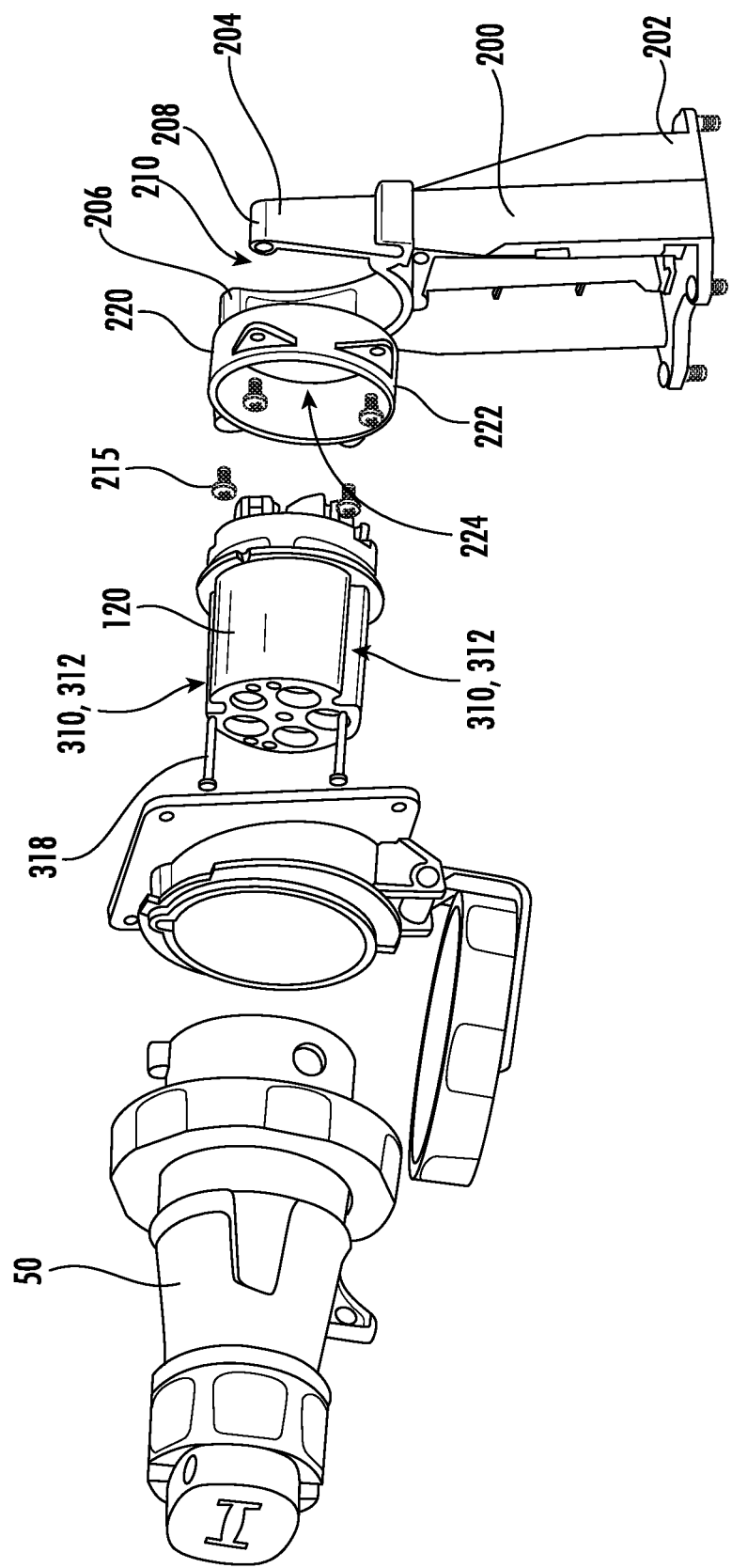
FIG. 3 is a partial, exploded perspective view of an adapter in accordance with one aspect of the mechanical interlock shown in FIG. 1, the adapter coupling a connector to a contact carrier bracket.

As such, referring to FIGS. 1 and 3, in accordance with one aspect of the present disclosure, as previously mentioned, the mechanical interlock 100 may include an adapter 220 for operatively coupling the contact carrier bracket 200 to the connector 120, which receives the plug 50. In this manner, a single contact carrier bracket 200 can be manufactured, stored, and incorporated into every mechanical interlock regardless of which connector 120 is being used. That is, individual adapters 220 corresponding to each connector 120 can be manufactured and stored. Thereafter, based on the required connector 120, the corresponding adapter 220 can be selected and coupled to the contact carrier bracket 200. In use, manufacturing of individual adapters is less complex and less costly then manufacturing individual contact carrier brackets 200. That is, by incorporating an adapter 220 in-between the connector 120 and the contact carrier bracket 200, different sized connectors 120 can be coupled to a common contact carrier bracket 200. The adapter 220 minimizes complex tooling and reduces costs (e.g., adapters 220 are simpler and cheaper to manufacture as compared to contact carrier brackets 200). That is, incorporation of adapters facilitates easier and less costly manufacturing by, inter alia, eliminating tooling changeovers associated with manufacturing large and complicated contact carrier brackets.

It should be noted that although a single contact carrier bracket has been described, it is envisioned that more than one contact carrier bracket may be required for one or more various reasons. In any event, the use of an intermediate adapter 220 facilitates a reduction in the overall number of required contact carrier brackets needed to be manufactured and/or stored.

Referring to FIG. 3, in one example embodiment, the contact carrier bracket 200 may include a first end 202 for coupling to, for example, the base plate 250 or the enclosure 110, and a second end 204 arranged and configured for coupling to the adapter 220, which is arranged and configured to receive the connector 120. As illustrated, the second end 204 may include first and second arms 206, 208 defining a space 210 therebetween. As illustrated, the adapter 220 may be in the form of a ring having an outer circular shape 222 and an interior opening 224. In use, the adapter 220 may be arranged and configured to be at least partially received within the space 210 formed between the first and second arms 206, 208, although it is envisioned that the adapters and the contact carrier bracket may take many different forms.

The adapter 220 may be coupled to the contact carriers bracket 200 by any suitable mechanism now known or hereafter developed including, for example, adhesive, bonding, etc. As illustrated, the adapter 220 may be coupled to the first and second arms 206, 208 via one or more fasteners 215. Thereafter, the connector 120 may be positioned within the interior opening 224 formed in the adapter 220.

In one example embodiment, each adapter 220 may be color coded, with each color corresponding to a specific connector 120, which adds a level of failsafe to the selection and assembly process. That is, as will be appreciated by one of ordinary skill in the art, plugs and their corresponding connectors 120 can be provided in any number of configurations. For example, different current levels (e.g., 16 A, 20 A, 30 A, 32 A, 60 A, 100 A, 150 A, 200 A, 400 A, or the like), different voltage levels (e.g., 125V, 240V, 250V, 480V, 600V, 100/130V, 125/250V, 102/208V, 200/250V, 208/250V, 277/480V, 346-415V, 347/600V, 380/415V, 440-460V, and others), and/or different ground pin locations (e.g., depending on the individual plug and connector, the ground pin, located in the connector, is positioned in a particular location along the circumference of the connector to ensure that the connector is only able to receive a corresponding plug, referred to herein as a "clock position").

Figure 5:
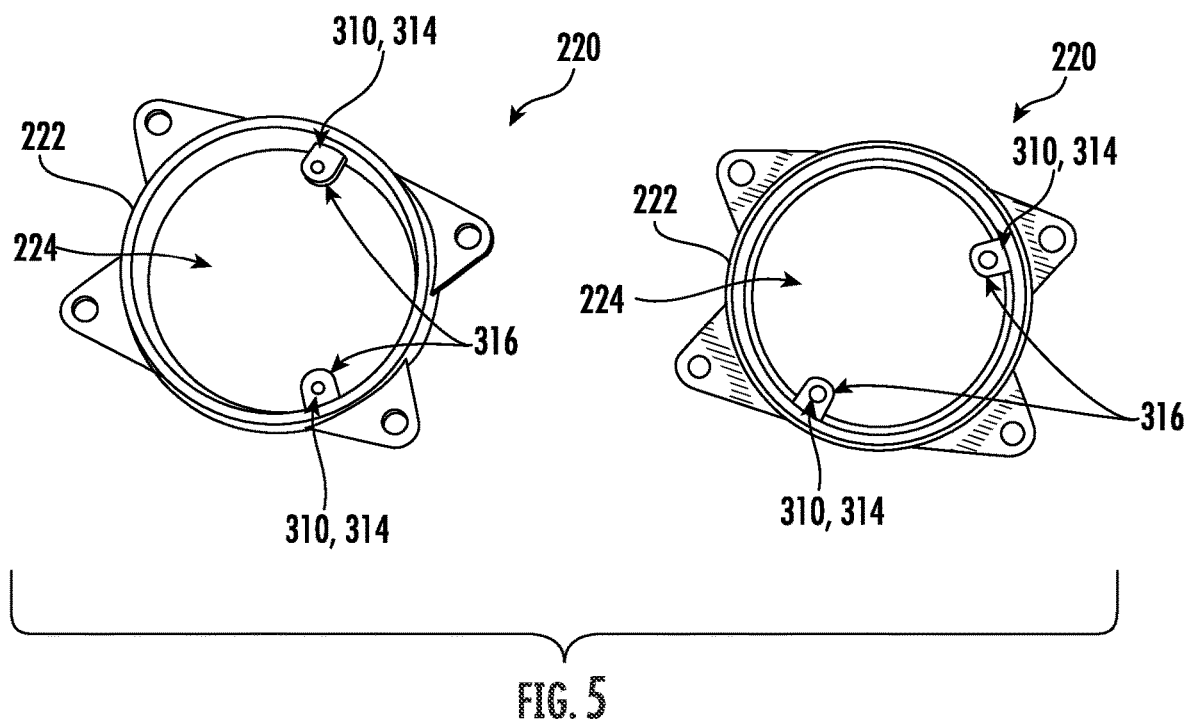
FIG. 5 is a perspective view of various adapters shown in FIGS. 3, 4A, and 4B, the adapters having a different configuration and color.

In use, referring to FIG. 5, the adapter 220 may be selected from a plurality of adapters 220. In one embodiment, each adapter 220 can be color coded to a specific connector 120 to ease selection of the correct adapter 220 so that, during assembly, depending on the configuration of the connector 120 being assembled into the enclosure 110, a color-coded adapter 220 can be selected thereby simplifying the assembly process and/or quality control verification. That is, the adapters 220 can be color-coded for a specific voltage and/or clock position.

Figure 4A:
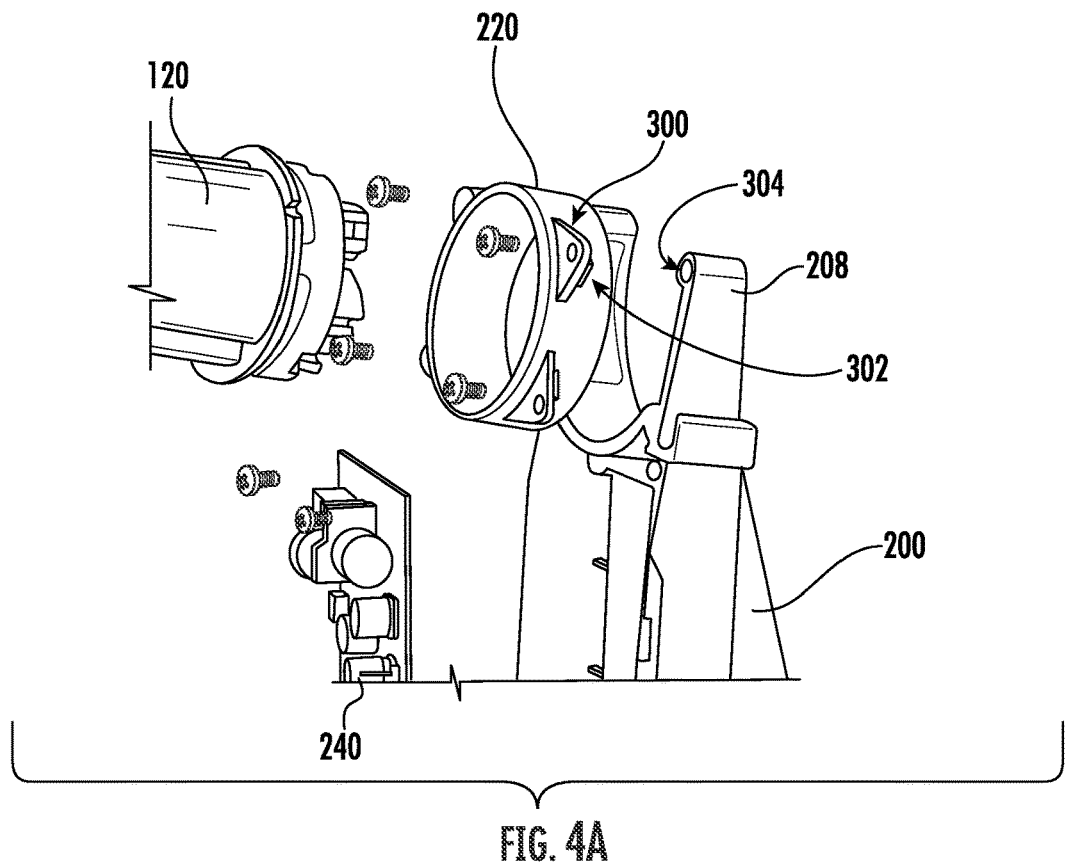
FIG. 4A is another partial, exploded perspective view of the adapter shown in FIG. 3.
Figure 4B:
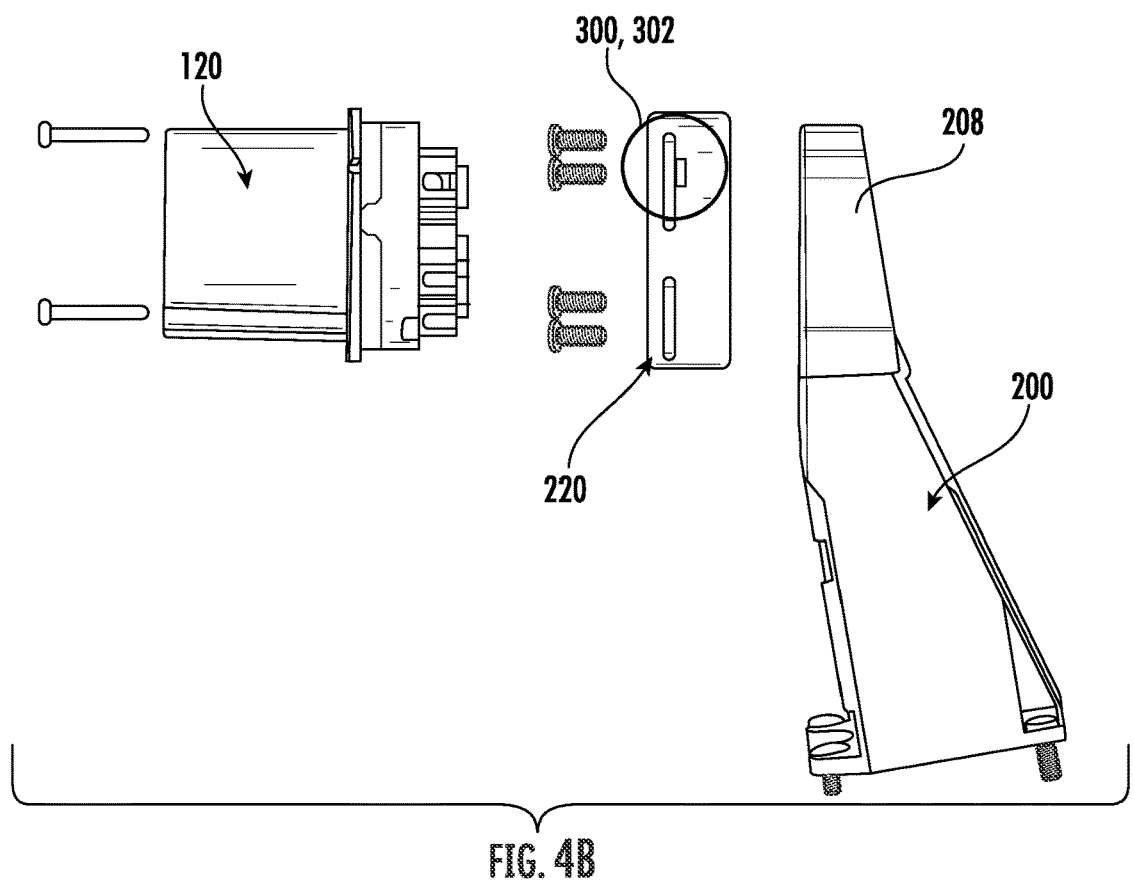
FIG. 4B is a partial, exploded side view of the adapter shown in FIG. 3.

Additionally, referring to FIGS. 4A and 4B, in use, the adapter 220 and the contact carrier bracket 200 may include an alignment, key or keying feature (e.g., a Poke-Yoke mechanism) 300 incorporated therebetween (alignment, key and keying are used interchangeably herein without the intent to limit) to ensure that the adapter 220 is properly positioned relative to the contact carrier bracket 200 when coupled thereto. That is, in one example embodiment, the adapter 220 and the contact carrier bracket 200 include a first key 300 to ensure that the adapter 220 can only be coupled to the contact carrier bracket 200 in a single, proper position.

Moreover, referring to FIG. 5, in use, the connector 120 and the adapter 220 may include a key 310 incorporated therebetween to ensure that the connector 120 is properly positioned relative to the adapter 220 when coupled thereto. That is, in one example embodiment, the connector 120 and the adapter 220 include a second key 310 to ensure that the connector 120 can only be coupled to the adapter 220 in a single, proper position.

In this manner, by keying the position of the connector 120 relative to the adapter 220 and by keying the position of the adapter 220 relative to the contact carrier bracket 200, proper positioning (e.g., proper clock positioning of the connector 120) is ensured. By preventing incorrect installation of the adapter 220 relative to the contact carrier bracket 200 and/or relative to the connector 120, incorrect final position of the connector 120 relative to the contact carrier bracket 200 is prevented. That is, the adapters 220 are preferably arranged and configured to ensure that the adapter 220, and hence the connector 120 received thereby, can only be coupled to the contact carrier bracket 200 in a single orientation (e.g., orientation can be defined by orienting the ground pin in the connector 120 relative to the contact carrier bracket 200 at a "clock position" such as, for example, 6 o'clock, 7 o'clock, or the like).

In use, for example, the various keys 300, 310 may be arranged and configured so that if the connector 120 was improperly coupled to the adapter 220 such as, for example, the connector 120 was improperly rotated relative to the adapter 220, and/or the adapter 220 was improperly coupled to the contact carrier bracket 200 such as, for example, the adapter 220 was inserted in a flipped or reverse position and/or if the adapter 220 was installed in an incorrect rotational position relative to the contact carrier bracket 200, the keys 300, 310 will not align with the associated surfaces of the connector 120 and/or the carrier bracket 200, thus preventing incorrect coupling of the connector 120 to the adapter 220 and/or the adapter 220 to the contact carrier bracket 200.

It should be appreciated that numerous variations of keys 300, 310 may be utilized to ensure that the connector 120 can only be coupled to the adapter 220 and that the adapter 220 can only be coupled to the contact carrier bracket 200 in a single, proper orientation. As such, the keys 300, 310 may be any suitable mechanism or keying feature now known or hereafter developed so long as improper coupling and/or orientation of the connector 120 relative to the adapter 220 and/or the adapter 220 relative to the contact carrier bracket 200 is prevented. As such, the present disclosure should not be limited to any particular key described and illustrated herein unless specifically claimed.

In one example embodiment, referring to FIGS. 4A and 4B, the adapter 220 may include one or more male features, bosses, projections, or the like 302 (used interchangeably herein without the intent to limit) and the contact carrier bracket 200 may include one or more female features, openings, holes, or the like 304 (used interchangeably herein without the intent to limit), arranged and configured to mate with the boss 302 formed on the adapter 220, or vice-versa. In this manner, the boss 302 extending from the adapter 220 can only be received within the hole 304 formed in the contact carrier bracket 200 when the adapter 220 is properly positioned relative to the contact carrier bracket 200, thus ensuring easy and failsafe assembly. That is, in this manner, each configuration of adapter 220 can only be installed in a single orientation (e.g., cannot be accidentally or unintentionally flipped and/or rotated, thus changing, for example, the clock position of the ground pin in the connector 120), thus, ensuring proper orientation and/or positioning of the adapter 220 relative to the contact carrier bracket 200, and hence proper positioning of the clock position or ground pin location of the connector 120.

In one example embodiment, the adapter 220 may include a first boss 302 protruding therefrom and the contact carrier bracket 200 may include a first hole 304 for receiving the first boss 302 extending from the adapter 220. The boss 302 and the hole 304 may be arranged and configured so that the first boss 302 is only receivable by the first hole 304 when the adapter 220 is properly positioned and/or orientated relative to the contact carrier bracket 200. By providing a key 300, the adapter 220 cannot be incorrectly coupled relative to the contact carrier bracket 200. In use, the key 300 may include different sized bosses and holes, different shaped bosses and holes, etc.

In one example embodiment, referring to FIGS. 3 and 5, the connector 120 may include one or more features, recesses, flat portions, or the like 312 (used interchangeably herein without the intent to limit) and the adapter 220 may include one or more features, bosses, projections, flat portions, or the like 314 (used interchangeably herein without the intent to limit), arranged and configured to mate with the feature 312 formed on the connector 120, or vice-versa. For example, as illustrated, the adapter 220 may include one or more projections 314 extending inwardly therefrom for mating with one or more recesses 312 formed in the connector 120. The projection 314 may include a threaded bore 316 for receiving a fastener 318 for coupling the connector 120 to the adapter 220. In this manner, the feature 314 formed on the adapter 220 can only mate with the feature 312 formed on the connector 120 when the connector 120 is properly positioned relative to the adapter 220, thus ensuring easy and failsafe assembly. That is, in this manner, each configuration of connector 120 can only be installed in a single orientation (e.g., cannot be accidentally or unintentionally rotated, thus changing, for example, the clock position of the ground pin in the connector 120), thus, ensuring proper orientation and/or positioning of the connector 120 relative to the adapter 220, and the adapter 220 relative to the contact carrier bracket 200, and hence proper positioning of the clock position or ground pin location of the connector 120.

Figure 6:
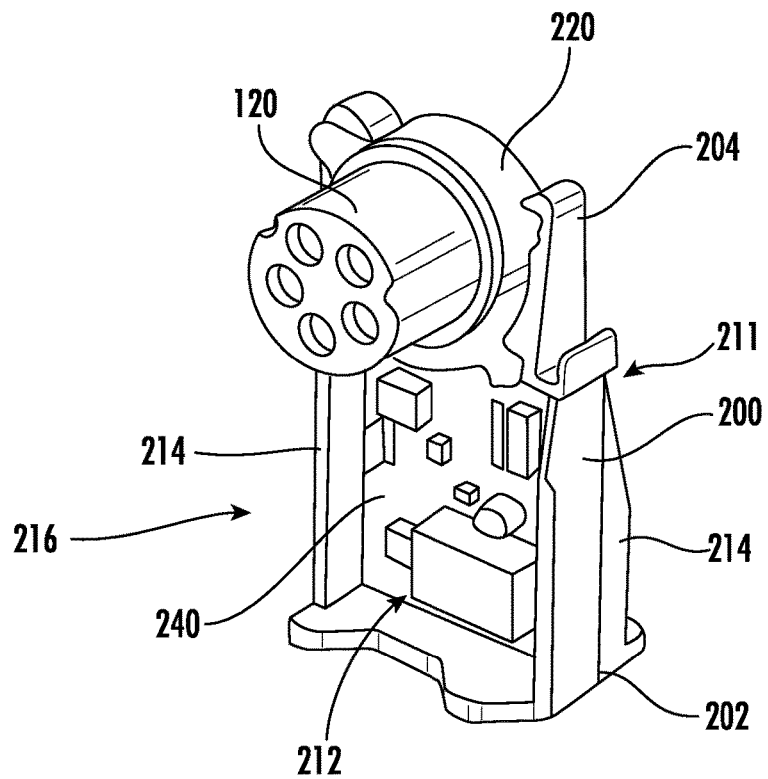
FIG. 6 is a perspective view of a contact carrier bracket in accordance with one aspect of the mechanical interlock shown in FIG. 1, the contact carrier bracket being coupled to a printed circuit board.

As previously mentioned, referring to FIGS. 1, 4A, and 6, the mechanical interlock 100 may also include one or more PCBs such as, for example, PCB 240 coupled to the contact carrier bracket 200. In accordance with another aspect of the present disclosure, referring to FIG. 6, the PCB 240 may be coupled (e.g., mounted) to the contact carrier bracket 200 to provide an increased level of protection from, for example, the environment (e.g., water, etc.) and to provide an increased level of protection from damage associated, for example, with dropping the device, transporting, etc. That is, as illustrated, when coupled to the enclosure 110, the contact carrier bracket 200 may include a top surface 211, a bottom surface 212, and laterally extending sidewalls 214 defining a recess 216. In use, the PCB 240 may be coupled to the bottom surface 212 of the contact carrier bracket 200 within the recess 216 in-between the sidewalls 214. In use, the contact carrier bracket 200 may include one or more features such as, for example, shelves, ribs, bosses, etc. to allow installation and support of the PCB 240. In use, the contact carrier bracket 200 provides protection to the PCB 240 from, for example, damage during assembly, wiring or installation, protection from accumulated debris and water, protection during transportation, etc. In use, the PCB 240 may be protected by the sidewalls 214 of the contact carrier bracket 200. The sidewalls 214 acting as strengthening or stiffening ribs for increased robustness of the bracket 200. As such, the PCB 240 may be protected and/or partially encased by the contact carrier bracket 200 thus protecting the PCB 240 from water, damage, or the like by forming a housing type envelope around the PCB 240.

The PCB 240 is coupled to the bottom surface 212 of the contact carrier bracket 200 and is sized and configured to fit within the space envelope formed between the sidewalls 214 of the contact carrier bracket 200. In this manner, the PCB 240 can be protected by the contact carrier bracket 200 from, for example, environmental and physical damage, thus ensuring a more robust design. Additionally, the PCB 240 can be installed and wired to the contact carrier bracket 200 before final bracket 200 installation (e.g., facilitates creation of a sub-assembly), as described above. In addition, the PCB 240 may include one or more keys (not shown) between, for example, the PCB 240 and the contact carrier bracket 200 to ensure installation in only one position, as described above.

While the present disclosure refers to certain embodiments, numerous modifications, alterations, and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof. The discussion of any embodiment is meant only to be explanatory and is not intended to suggest that the scope of the disclosure, including the claims, is limited to these embodiments. In other words, while illustrative embodiments of the disclosure have been described in detail herein, it is to be understood that the inventive concepts may be otherwise variously embodied and employed, and that the appended claims are intended to be construed to include such variations, except as limited by the prior art.

The foregoing discussion has been presented for purposes of illustration and description and is not intended to limit the disclosure to the form or forms disclosed herein. For example, various features of the disclosure are grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The phrases "at least one", "one or more", and "and/or", as used herein, are open-ended expressions that are both conjunctive and disjunctive in operation. The terms "a" (or "an"), "one or more" and "at least one" can be used interchangeably herein. All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., engaged, attached, coupled, connected, and joined) are to be construed broadly and may include intermediate members between a collection of elements and relative to movement between elements unless otherwise indicated. As such, connection references do not necessarily infer that two elements are directly connected and in fixed relation to each other. All rotational references describe relative movement between the various elements. Identification references (e.g., primary, secondary, first, second, third, fourth, etc.) are not intended to connote importance or priority but are used to distinguish one feature from another. The drawings are for purposes of illustration only and the dimensions, positions, order and relative to sizes reflected in the drawings attached hereto may vary.

What is claimed is:

1. A mechanical interlock comprising
an enclosure including an interior cavity;
a connector at least partially receivable within the enclosure for selectively receiving a plug;
a load switch positionable within the enclosure, the load switch arranged and configured to selectively supply power to the connector;
a contact carrier bracket for coupling the connector to the enclosure;
a base plate arranged and configured for receiving the contact carrier bracket and the load switch thereon to form a base plate subassembly, the base plate subassembly being selectively positionable within the interior cavity of the enclosure after the contact carrier bracket and load switch have been coupled to the base plate; and
a printed circuit board (PCB) electrically coupleable to the load switch and the connector, wherein the PCB is at least partially encased by the contact carrier bracket to provide protection to the PCB.

2. The mechanical interlock of claim 1, wherein the contact carrier bracket includes a top surface, a bottom surface, and laterally extending sidewalls defining a recess, the PCB being coupleable to the bottom surface of the contact carrier bracket within the recess in-between the sidewalls.

3. A mechanical interlock comprising:
an enclosure including a rear base portion and a front housing portion, the rear base portion including a rear wall, a plurality of periphery walls extending from the rear wall, and an interior cavity;
a connector at least partially receivable within the enclosure for selectively receiving a plug; and
a base plate subassembly removably mounted within the interior cavity, the base plate subassembly comprising:
a base plate positionable with the interior cavity, the base plate being removably coupled to the rear wall of the enclosure;
a load switch mounted on the base plate, the load switch arranged and configured to selectively supply power to the connector;
a contact carrier bracket mounted on the base plate, the contact carrier configured to couple the connector to the base plate; and
a printed circuit board (PCB) electrically coupleable to the load switch and the connector, wherein the PCB is at least partially encased by the contact carrier bracket.

4. The mechanical interlock of claim 3, wherein the contact carrier bracket includes a top surface, a bottom surface, and laterally extending sidewalls defining a recess, the PCB being coupleable to the bottom surface of the contact carrier bracket within the recess in-between the sidewalls.

5. The mechanical interlock of claim 3, wherein the connector is coupleable to the contact carrier bracket, the contact carrier bracket is mounted onto the base plate, the load switch is mounted onto the base plate, and the connector is configured to be wired to the load switch prior to the base plate subassembly being received within the interior cavity of the enclosure.

6. The mechanical interlock of claim 3, further comprising an adapter for operatively coupling the connector to the contact carrier bracket, the adapter selected from a plurality of adapters, each adapter of said plurality of adapters having at least one of a size and a shape that is different from other adapters of said plurality of adapters, the selected adapter sized and shaped to engage the connector.

7. The mechanical interlock of claim 6, wherein:
the contact carrier bracket includes a first end and a second end, the second end being arranged and configured to receive the adapter; and
the adapter includes an interior opening for receiving the connector.

8. The mechanical interlock of claim 6, wherein the adapter and the contact carrier bracket include a first key so that the adapter is properly positioned relative to the contact carrier bracket when coupled thereto.

9. The mechanical interlock of claim 8, wherein the first key includes a male feature formed on one of the adapter and the contact carrier bracket, and a female feature formed on the other one of the adapter and the contact carrier bracket to ensure that the adapter can only be coupled to the contact carrier bracket when the male feature mates with the female feature.

10. The mechanical interlock of claim 9, wherein the male feature is a boss and the female feature is a recess, the recess being sized and configured to receive the boss.

11. The mechanical interlock of claim 8, wherein the connector and the adapter include a second key so that the connector is properly positioned relative to the adapter when coupled thereto.

12. The mechanical interlock of claim 11, wherein the second key includes a male feature formed on one of the connector and the adapter, and a female feature formed on the other one of the connector and the adapter to ensure that the connector can only be coupled to the adapter when the male feature mates with the female feature.

13. The mechanical interlock of claim 12, wherein the male feature of the second key includes one or more projections and the female feature of the second key includes one or more recesses sized and configured to receive the one or more projections, respectively.

14. The mechanical interlock of claim 3, further comprising:
an adapter configured to operatively couple the connector to the contact carrier bracket, the adapter selected from a plurality of adapters, wherein the selected adapter has a different size or shape from the others of said plurality of adapters, the selected adapter sized and shaped to engage the connector; and
an alignment key arranged and configured to orient:
the selected adapter to the contact carrier bracket; and
the selected adapter to the connector.

15. The mechanical interlock of claim 14, wherein the alignment key comprises a first alignment key and a second alignment key, wherein the first alignment key is configured to orient the selected adapter to the contact carrier bracket and the second alignment key is configured to orient the selected adapter to the connector.

16. The mechanical interlock of claim 14, wherein:
the contact carrier bracket includes a first end and a second end, the second end being arranged and configured to receive the adapter; and
the adapter includes an interior opening for receiving the connector.

17. The mechanical interlock of claim 14, wherein each of the plurality of adapters is color-coded for use with a particular configuration of the connector.

18. The mechanical interlock of claim 14, wherein the alignment key includes a first key positioned between the adapter and the contact carrier bracket so that the adapter is properly positioned relative to the contact carrier bracket when coupled thereto.

19. The mechanical interlock of claim 18, wherein the first key includes a male feature formed on one of the adapter and the contact carrier bracket, and a female feature formed on the other one of the adapter and the contact carrier bracket to ensure that the adapter can only be coupled to the contact carrier bracket when the male feature mates with the female feature.

20. The mechanical interlock of claim 19, wherein the male feature is a boss and the female feature is a recess, the recess being sized and configured to receive the boss.

21. The mechanical interlock of claim 18, wherein the alignment key includes a second key positioned between the connector and the adapter so that the connector is properly positioned relative to the adapter when coupled thereto.

22. The mechanical interlock of claim 21, wherein the second key includes a male feature formed on one of the connector and the adapter, and a female feature formed on the other one of the connector and the adapter to ensure that the connector can only be coupled to the adapter when the male feature mates with the female feature.

23. The mechanical interlock of claim 22, wherein the male feature of the second key includes one or more projections and the female feature of the second key includes one or more recesses sized and configured to receive the one or more projections, respectively.

* * * * *